United States Patent
Yamaguchi et al.

(10) Patent No.: US 6,737,613 B2
(45) Date of Patent: May 18, 2004

(54) HEAT TREATMENT APPARATUS AND METHOD FOR PROCESSING SUBSTRATES

(75) Inventors: Takatomo Yamaguchi, Tokyo (JP); Kazuhiro Morimitsu, Tokyo (JP); Tatsuhisa Matsunaga, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 10/395,179

(22) Filed: Mar. 25, 2003

(65) Prior Publication Data

US 2003/0183614 A1 Oct. 2, 2003

(30) Foreign Application Priority Data

Mar. 26, 2002 (JP) .................................. 2002-085137

(51) Int. Cl.[7] .................................................. F27B 5/14
(52) U.S. Cl. .................... 219/390; 219/405; 219/411; 118/724; 118/725; 118/50.1; 392/416; 392/418
(58) Field of Search ........................ 219/390, 405, 219/411; 392/416, 418; 118/724, 725, 50.1

(56) References Cited

U.S. PATENT DOCUMENTS 6,259,061 B1 * 7/2001 Osawa ....................... 219/390
6,369,361 B2    4/2002 Saito et al.
6,407,368 B1 * 6/2002 Hsu et al. ................... 219/390
6,444,940 B1    9/2002 Saito et al.
6,589,349 B2 * 7/2003 Kashiwagi et al. ......... 118/708

FOREIGN PATENT DOCUMENTS

JP          9-7955          1/1997

* cited by examiner

*Primary Examiner*—Shawntina Fuqua
(74) *Attorney, Agent, or Firm*—Bacon & Thomas

(57) ABSTRACT

A heat treatment apparatus includes a vertically disposed process tube defining a reaction chamber therein; a main heater for heating the reaction chamber, the main heater being disposed outside of the process tube; a boat for holding a plurality of wafers, the boat being loaded into and unloaded from the reaction chamber; and a boat rotating device for rotating the boat. The boat rotating device is provided with a rotatable hollow shaft assembly and a fixed shaft coaxially disposed inside the rotatable hollow shaft assembly. A sub-heater is attached to an upper end of the fixed shaft, and the boat and an insulating portion are disposed on the rotatable hollow shaft assembly.

8 Claims, 6 Drawing Sheets

US 6,737,613 B2

HEAT TREATMENT APPARATUS AND METHOD FOR PROCESSING SUBSTRATES

FIELD OF THE INVENTION

The present invention relates to an apparatus and method for processing objects loaded in a reaction chamber while being heated with a heater; and, more particularly, to a heat treatment apparatus and method applicable to, e.g., an oxidation and diffusion processes for semiconductor wafers (hereinafter, referred to as wafers) having semiconductor integrated circuits (ICs) therein, a carrier activation process after ion implantation, a reflow process for planarization, an annealing process and a film forming process by thermal CVD reaction.

BACKGROUND OF THE INVENTION

In a method for fabricating an IC, a vertical batch type hot-wall heat treatment apparatus (hereinafter, referred to as a vertical heat treatment apparatus) has been widely used in performing a heat treatment process on wafers. Such a vertical heat treatment apparatus includes a vertically disposed process tube provided with an inner tube, defining a reaction chamber therein, into which the wafers are loaded, and an outer tube surrounding the inner tube. Further included in the vertical heat treatment apparatus is a heater for heating the inside of the process tube, which is installed to the outside of the process tube, wherein a plurality of the wafers that are vertically stacked in a boat are loaded into the inside of the inner tube through a furnace mouth formed at the bottom thereof, and then the inside of the reaction chamber is heated to perform the heat treatment for the wafers.

In particular, some vertical heat treatment apparatuses are provided with a sub-heater at the bottom portion of the reaction chamber where large heat loss occurs, expediting the heat treatment process of the wafers by enabling temperature recovery and stability in a timely manner. However, such apparatuses suffer from its inability to rotate, which leads to deterioration of uniformity in thickness of thin film on a wafer (i.e., intra-wafer nonuniformity in film thickness). As a result, there has been proposed another type of vertical heat treatment apparatus, as disclosed in Japanese Patent Application Laid-Open Nos. 2001-156005 and 2001-210631, which include the sub-heater and a device for rotating the boat in order to improve intra-wafer uniformity in temperature as well as inter-wafer uniformity in temperature.

The vertical heat treatment apparatus disclosed in the former includes an insulating unit which is fixed on a cover and disposed between a boat and the cover for closing the lower end of the process tube, and a rotatable shaft for rotating the boat, which axially penetrates the center portion of the insulating unit. Disposed on the upper portion of the insulating unit is a sub-heater and disposed in the rotatable shaft are feeding lines for supplying electricity to the sub-heater.

Further, in the vertical heat treatment apparatus disclosed in the latter, an insulating body is disposed on a turntable for rotating the boat, and a sub-heater arranged in a planar shape is installed in the upper portion of the insulating body.

However, such a vertical heat treatment apparatus disclosed in Japanese Patent Application Laid-Open No. 2001-156005, has certain deficiencies. For instance, by forming a hole in the central portion of the sub-heater, through which the rotatable shaft passes, the sub-heater does not provide a sufficient amount of heat to the central portion of the wafers held in the boat, thereby significantly deteriorating intra-wafer uniformity in temperature distribution. Further, the rotatable shaft penetrating the insulating unit, is slenderly formed in order to reduce the above-mentioned side effects, entailing limitations in stably supporting a heavy boat.

In addition, the vertical heat treatment apparatus disclosed in Japanese Patent Application Laid-Open No. 2001-210631, has a problem of requiring a slippage ring in rotating the insulating body.

SUMMARY OF THE INVENTION

It is therefore, an object of the present invention to provide a vertical heat treatment apparatus capable of improving intra-wafer and inter-wafer uniformities in temperature, while performing a heat treatment process on wafers held in a boat.

In accordance with one aspect of the invention, there is provided a heat treatment apparatus including: a vertically disposed process tube defining a reaction chamber therein; a main heater for heating the reaction chamber, the main heater being disposed outside of the process tube; a boat for holding a plurality of wafers, the boat being loaded into and unloaded from the reaction chamber; and a boat rotating device for rotating the boat; wherein the boat rotating device includes a rotatable hollow shaft assembly and a fixed shaft coaxially disposed inside the rotatable hollow shaft assembly, and wherein a sub-heater is attached to an upper end of the fixed shaft, and the boat and an insulating portion are disposed on the rotatable hollow shaft assembly.

In accordance with still another aspect of the invention, there is provided a heat treatment apparatus including: a vertically disposed process tube defining a reaction chamber therein; a main heater for heating the reaction chamber, the main heater being disposed outside of the process tube; a revolving insulating unit; and a boat for holding a plurality of wafers, the boat being loaded into and unloaded from the reaction chamber, the boat being disposed on the revolving insulating unit and rotated therewith; wherein a horizontal circular portion of a sub-heater is fixedly installed inside the revolving insulating unit or an upper part thereof, and one or more feeding lines for supplying electricity to the sub-heater are provided substantially along a rotational axis of the boat.

In accordance with still another aspect of the invention, there is provided a method for fabricating semiconductor devices, including the steps of: loading a plurality of wafers into a boat; loading the boat into a reaction chamber of a vertically disposed process tube; heating the plurality of wafers with a sub-heater installed on a fixed shaft aligned with respect to a vertical axis of the boat while rotating the boat with a rotatable hollow shaft assembly disposed outside the fixed shaft, during or after loading the boat into the reaction chamber; processing the plurality of wafers by supplying one or more processing gases to flow into the reaction chamber when a temperature thereof reaches a treatment temperature; reducing the temperature of the reaction chamber; unloading the boat from the reaction chamber; and discharging the plurality of wafers from the boat.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Preferred embodiments of the present invention will now be described with reference to the accompanying drawings.

Figure 1:
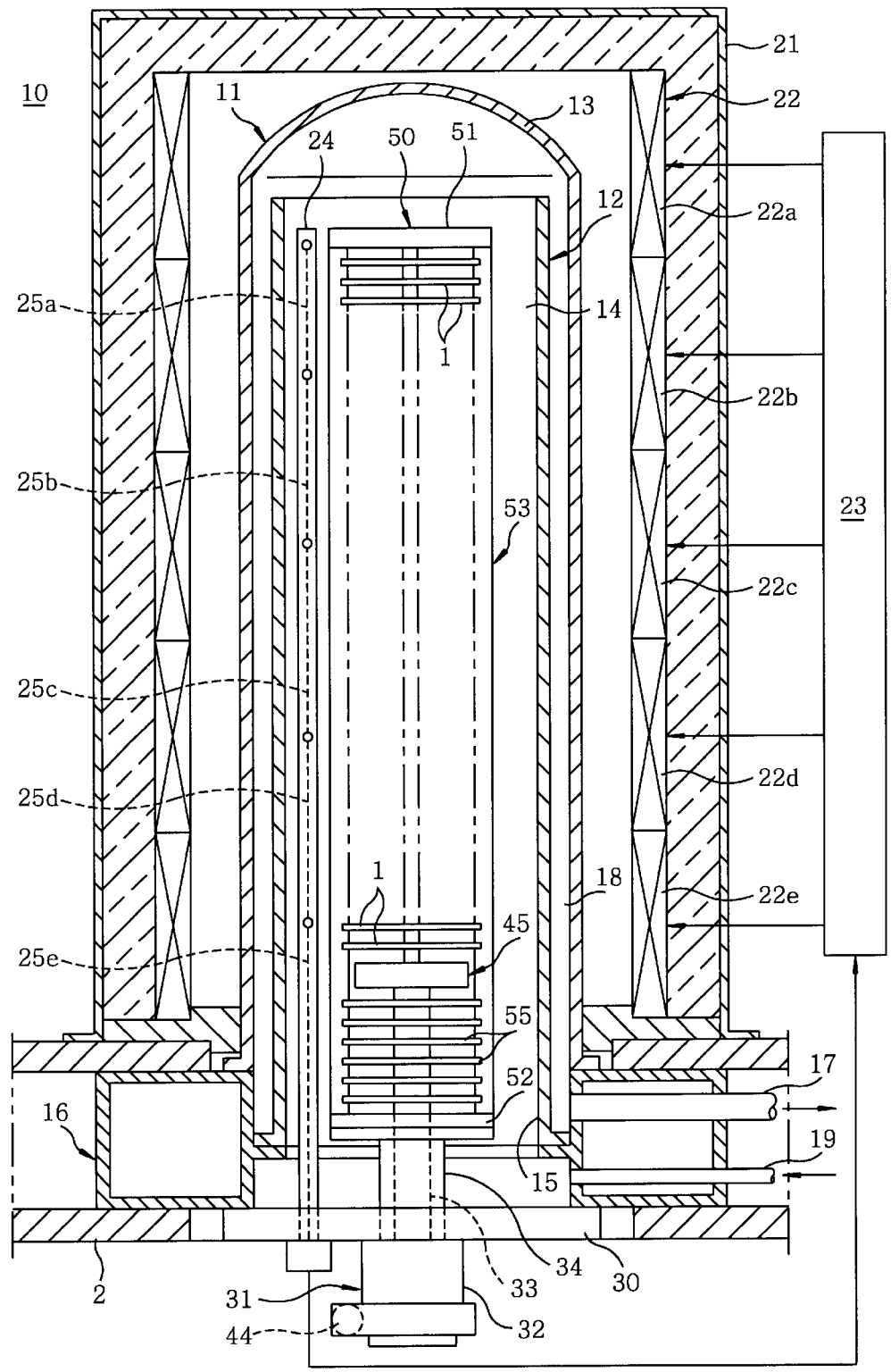
FIG. 1 illustrates a vertical cross sectional view of a vertical heat treatment apparatus in accordance with a first preferred embodiment of the present invention.

Referring to FIG. 1, there is illustrated a vertical heat treatment apparatus (a vertical batch type heat treatment apparatus) 10 of the present invention, which is used to perform a heat treatment process in fabricating IC. The vertical heat treatment apparatus 10 includes vertically displaced process tube 11 having an inner tube 12 and an outer tube 13 so that its longitudinal centerline is vertical. The cylindrical inner tube 12, made of quartz or silicon carbide (SiC) is seamlessly formed with its upper end and lower end open. The cylindrical outer tube 13 made of quartz is seamlessly formed with its upper end closed and its lower end open. The inner tube 12 defines a reaction chamber 14 therein, into which a plurality of vertically stacked wafers 1 held in a boat 50 are loaded. The open lower end of the inner tube 12, whose inner diameter is set to be greater than the outer diameter of the wafers 1, e.g., 300 mm, forms a furnace mouth 15 for use in loading and unloading the plurality of the wafers 1.

The outer tube 13, whose inner diameter is greater than the outer diameter of the inner tube 12, is concentrically disposed enclosing the inner tube 12. The respective lower ends of the inner and outer tubes 12, 13 are hermetically sealed by a multi-staged cylindrical manifold 16. The manifold 16 which can be detached from the inner and outer tubes 12, 13 during maintenance or repair is supported by a housing plate 2 of the vertical heat treatment apparatus 10, so that the process tube 11 is vertically disposed.

An exhaust line 17 has one end connected to an upper portion of a side wall of the manifold 16 and the other to an exhaust device (not shown), so that the process tube can be evacuated therethrough. The exhaust line 17 communicates with an exhaust path 18, i.e., a space defined between the inner tube 12 and the outer tube 13, having a circular cross section. The exhaust line 17 is connected to the lowermost part of the exhaust path 18 through the manifold 16. In addition, connected at the lower portion of the side wall of the manifold 16 is a gas supply line 19 to thereby communicate with the furnace mouth 15 of the inner tube 12. And the other end of the gas supply line 19 is connected to source gas, carrier gas and purge gas supply devices (all not shown). Gases injected into the furnace mouth 15 through the gas supply line 19 flow from the lower portion of the reaction chamber 14 to the upper portion thereof and are then exhausted through the exhaust path 18 and the exhaust line 17.

As shown in FIG. 1, the process tube 11 is enclosed in a thermally insulated housing 21. More specifically, concentrically surrounding the outer tube of the process tube 11 is a main heater 22 provided on the interior wall of the thermally insulated housing 21 for heating the process tube 11. A cylindrical cover made of, e.g., a thin stainless plate, thermally insulated with a material such as glass wool, constitute the thermally insulated housing 21 vertically mounted on the housing plate 2. The inner diameter of the thermally insulated housing 21 is greater than the outer diameter of the outer tube 13, whereas its length is substantially equal to that of the outer tube 13.

The main heater 22 made of electrical resistant wire, e.g., nichrome wire, is helically wound around an inner peripheral surface of the thermally insulated housing 21, and is divided into five sectional heaters, i.e., a first, second, third, fourth and fifth sectional heaters 22a, 22b, 22c, 22d and 22e, sequentially disposed from the top. The sectional heaters 22a to 22e are subject to a sequence control of a temperature controller 23, in which they function independently or interactively.

As shown in FIG. 1, fixedly and perpendicularly inserted into an upper face of a cover 30 is a protection tube 24 which stands between the inner periphery of the inner tube 12 and the outer periphery of the boat 50 without having a contact with the boat 50 when the boat 50 is loaded into the reaction chamber 14. Sealed in the protection tube 24 are five thermocouples 25a, 25b, 25c, 25d, 25e which are all connected to the temperature controller 23, each thermocouple transmitting to the temperature controller 23 signals indicating temperature measurements. The temperature controller 23 controls the sectional heaters 22a to 22e based on the feedback data, i.e., measured temperatures, obtained by the thermocouples 25a to 25e. More specifically, by employing a negative feedback control of the temperature controller 23, the corresponding sectional heaters are controlled to eliminate/reduce difference between a target temperature and temperature measured by the thermocouples 22a to 22e.

As shown in FIG. 1, the cover 30 is vertically moved upward to close the furnace mouth 15. The cover 30 having greater outer diameter than the inner diameter of the manifold 16 is vertically moved by a boat elevator (not shown) installed vertically, outside of the process tube 11. And installed on a longitudinal centerline of the cover 30 is a boat rotating device 31 for rotating the boat 50.

Figure 2:
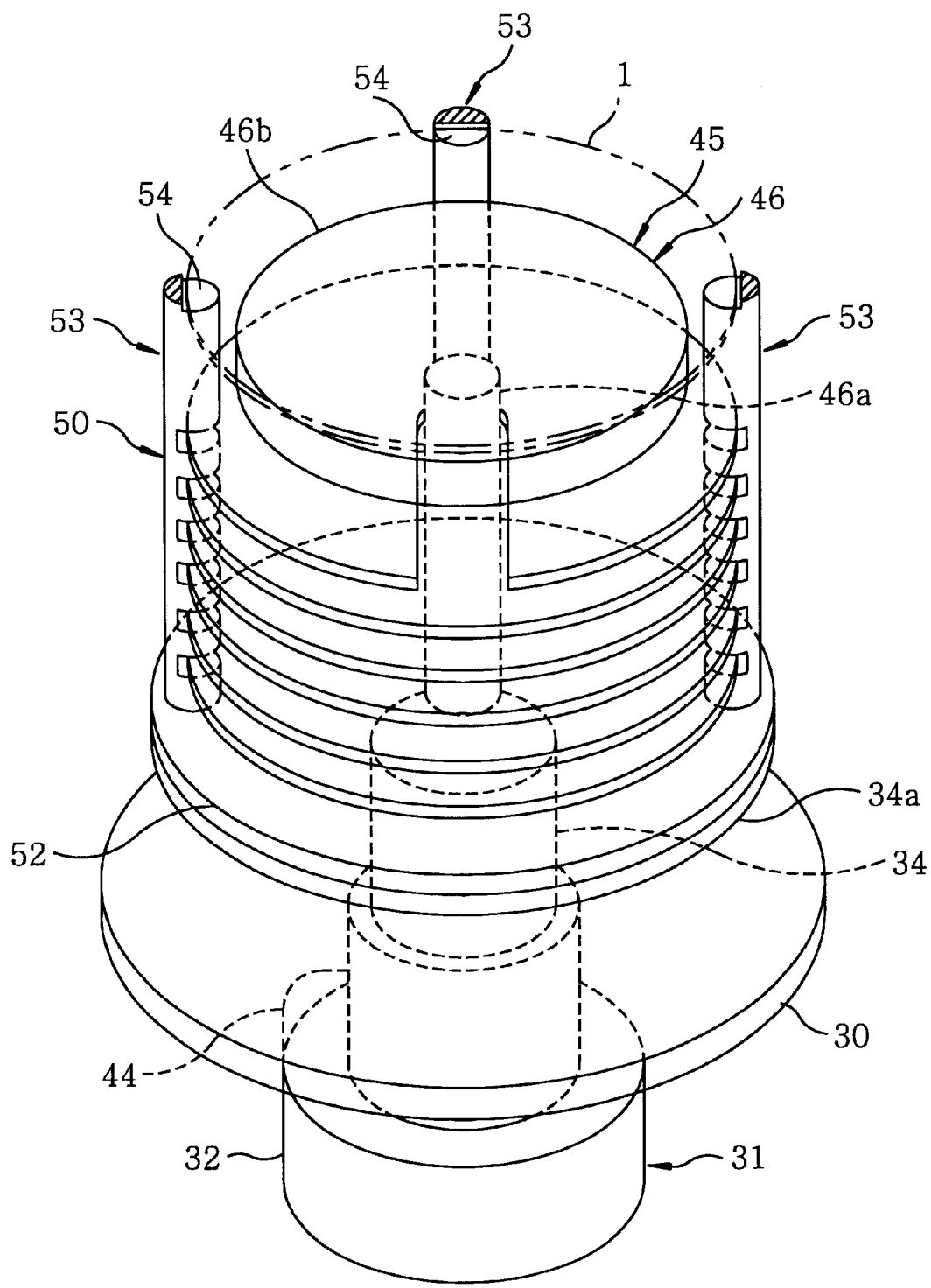
FIG. 2 provides a perspective view of a boat rotating device, insulating plates and a sub-heater included in the vertical heat treatment apparatus of the first preferred embodiment.
Figure 3:
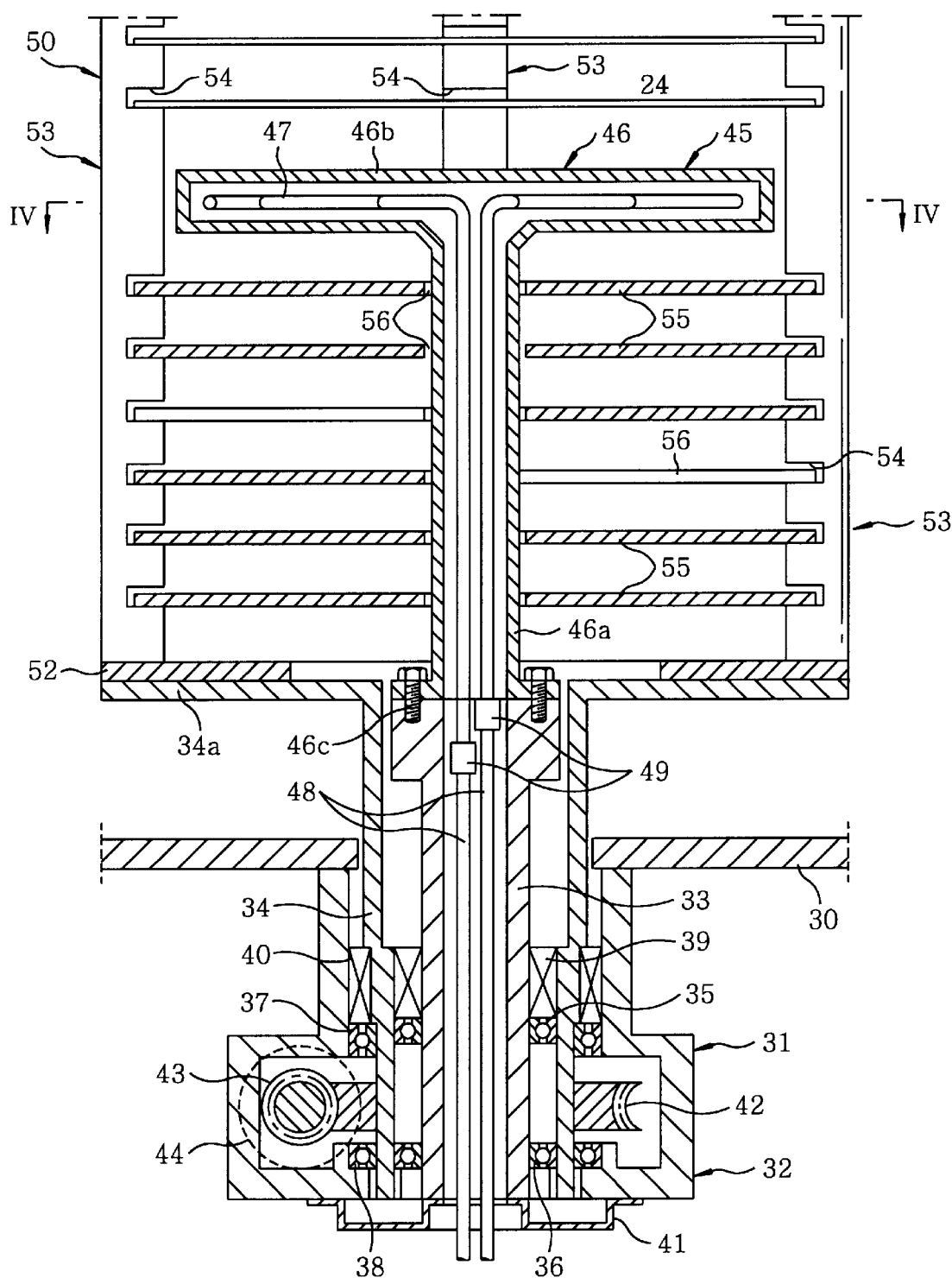
FIG. 3 provides a cross sectional view of the boat rotating device, the insulating plates and the sub-heater included in the vertical heat treatment apparatus of the first preferred embodiment.

Referring to FIGS. 2 and 3, there is illustrated the boat rotating device 31. The boat rotating device 31, attached fixedly and concentrically below the cover 30, is provided with a cylindrical hollow casing 32 with its upper end open and its lower end closed. In the interior of the casing 32 is a vertically erected, slenderly circular hollow post 33 fixed to the closed end thereof. Concentrically formed in the casing 32 is a circular hollow post 34 having an inner diameter greater than the outer diameter of the hollow post 33. Further, the hollow post 34 is rotatably supported by a set of inner bearings 35, 36, i.e., upper and lower, disposed between the hollow post 33 and the hollow shaft 34 and a set of outer bearing 37, 38, i.e., upper and lower, disposed between the casing 32 and the hollow shaft 34. Provided above the upper inner bearing 35 is an inner magnetic fluid seal 39, and provided above the upper outer bearing 37 is an outer magnetic fluid seal 40.

Inserted in the hollow shaft 34 is an inner hollow post 33 rigidly fixed to the lower end of the casing 32. The inner periphery of the outer hollow shaft 34 is rotatably mounted on the outer periphery of the inner hollow post 33 through a lower inner bearing 36 near the lower end of the inner hollow post 33 and through an upper inner bearing 35 near the middle of the inner hollow post 33. Below the lower closed end of the casing 32 is a cap 41 for closing the outer hollow shaft 34. Rotatably and coaxially mounted between a lower outer bearing 38 and an upper outer bearing 37 with respect to the outer periphery of the outer rotatable hollow shaft 34 is a worm wheel 42. The worm wheel 42 engages with a worm 43 rotated by an electric motor 44.

Mounted on the upper end of the inner hollow post 33 is a sub-heater 45 having an enclosure 46 made of, e.g., ceramics, and a heater line 47. The enclosure 46 is provided with a vertical tubular support 46a and a horizontal circular casing 46b. The sub-heater 45 is divided into a vertically extended portion formed with the vertical tubular support 46a and the heater line 47 therein, and a horizontal circular portion formed with the horizontal circular casing 46b and the heater line 47 therein. The lower end of the tubular support 46a is in contact with the upper end of the inner hollow post 33 and rigidly connected thereto by means of bolts 46c. The diameter of the circular casing 46b, provided with a hollow inner portion, horizontally and coaxially supported by the tubular support 46a, is less than that of the wafer 1.

Figure 4:
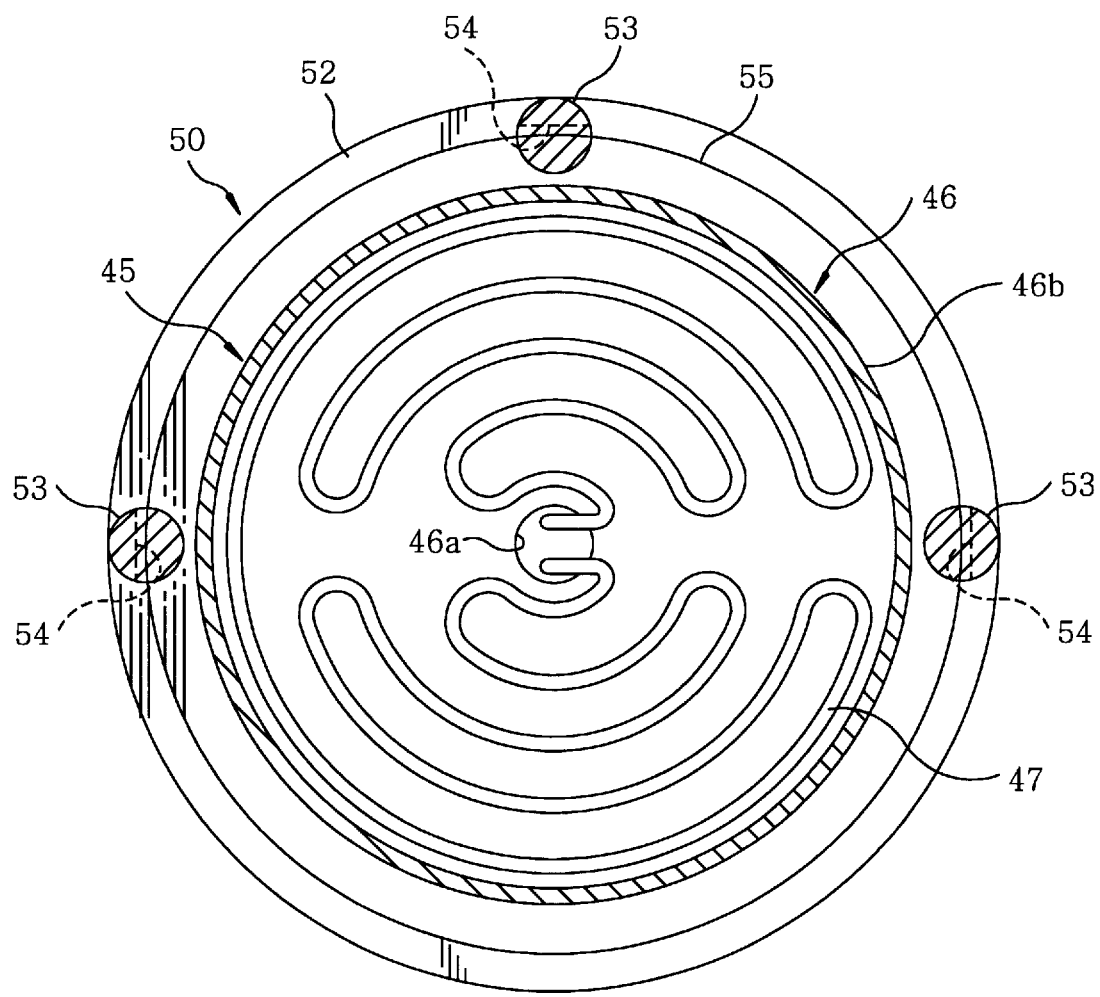
FIG. 4 sets forth a horizontal cross sectional view of the sub-heater taken along the line IV—IV in FIG. 3.

In the hollow inner portion, a resistance heating line 47 (hereinafter, referred to as a heater line 47) made of a resistance heating element, e.g., molybdenum silicide ($MoSi_2$), which causes little or no metallic contamination, is arranged forming plural concentric circles, each having a different diameter (shown in FIG. 4). The end portions of the heater line 47 are disposed in the central portion of the circular casing 46b, and has a perpendicular bend so that the end portions are inserted into the tubular support 46b and extended to the upper portion of the hollow post 33, where both ends of the heater line 47 are electrically connected to electric feeding lines 48 through connectors 49, respectively. The feeding lines 48 extend through the lower opening of the hollow post 33 to an external power supply (not shown).

Integrally and horizontally attached to the upper end of the hollow shaft 34 is a flange portion 34a on which the boat 50 is vertically disposed, wherein the hollow shaft 34 and the flange portion 34a constitute a rotatable hollow shaft assembly. The boat 50 is provided with a top plate 51, a bottom plate 52 and three supporting bars 53 as shown in FIG. 1. The supporting bars 53 connect the bottom and the top plates 51, 52. And a plurality of supporting grooves 54 are formed in the supporting bars 53 with predetermined intervals therebetween to hold wafers 1. By inserting the periphery edges of the wafer 1 into the supporting grooves 54 on a same horizontal plane, the wafers 1 are horizontally and concentrically held by the boat 50.

Figure 5:
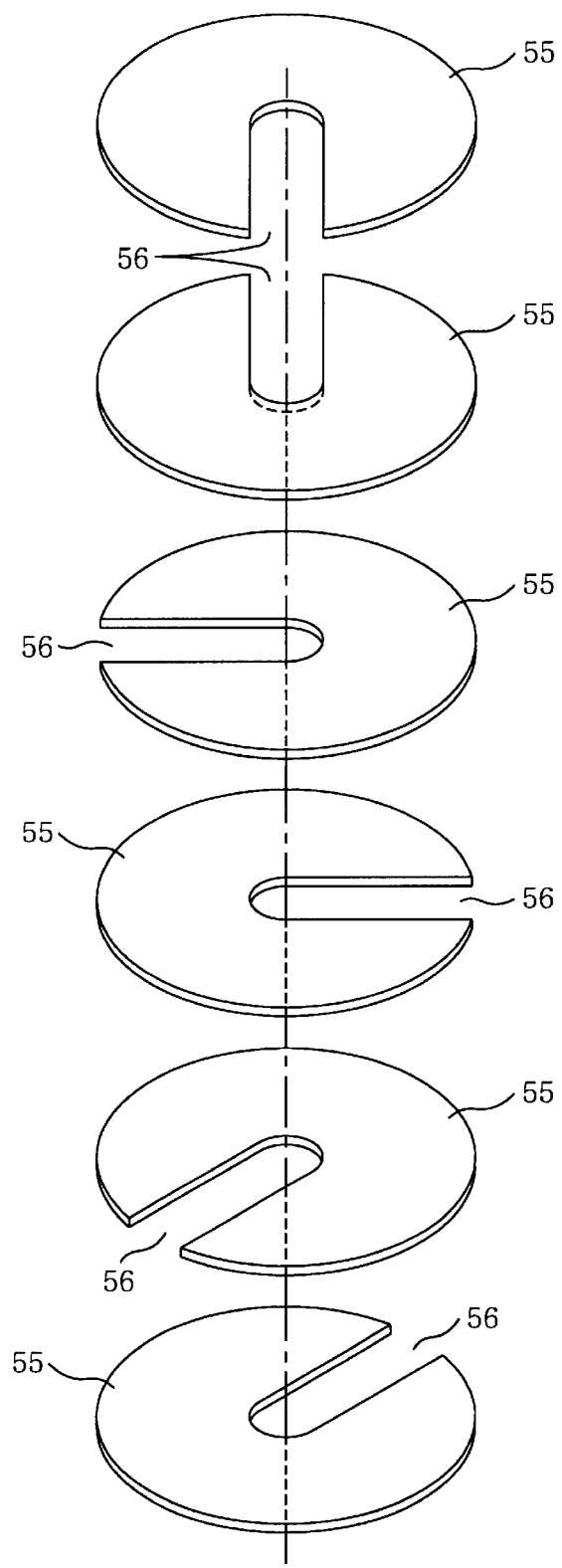
FIG. 5 describes a plurality of insulating plates of the present invention.

As shown in FIGS. 2 and 3, a plural number, for example, six in this preferred embodiment, of wafer-shaped insulating plates 55, made of quartz and having diameters substantially equal to that of the wafers 1, are horizontally inserted in the supporting grooves 54 of the supporting bars 53 below the circular casing 46b. Each of the insulating plates 55 is provided with a cutaway portion 56 formed from its center portion extending to its circumference, in particular extending radially as shown in FIG. 5. The width of the cutaway portion 56 is greater than the outer diameter of the tubular support 46a, and its length greater than the radius of the insulating plate 55. The insulating plates 55 are inserted in the supporting grooves 54 of the supporting bars 53, so that the respective cutaway portions 56 extend radially to different directions, ultimately avoiding overlapping of the cutaway portions 56. Therefore, by arranging the insulating plates 55 in a manner described above, an adverse affect induced by the overlapping of the cutaway portions 56 can be minimized. These insulating plates 55 constitute an insulating portion in the lower portion of the boat 50.

A heat treatment process in a method of fabricating an IC by using the vertical heat treatment apparatus 10, will now be described in another preferred embodiment of the present invention.

First, a plurality of the wafers 1 to be processed are loaded into the boat 50 by a wafer transferring device (not shown). As shown in FIG. 1, the boat 50 holding a plurality of the wafers 1 is mounted on the cover 30 in a way that the plurality of the wafers 1 are vertically stacked. Then, the boat 50 disposed on the cover 30 is raised by the boat elevator to be loaded into the reaction chamber 14 through the furnace mouth 15 of the inner tube 12.

In this preferred embodiment of the present invention, a lower group of the wafers 1 held in the lower portion of the boat 50 receive supplemental heat from the electrically powered heater line 47 of the sub-heater 45 during or after the boat loading process. In addition, by rotating the hollow shaft 34 by means of the electric motor 44, worm 43 and worm wheel 42, the boat 50 is rotated at a speed at which the inertia force of the wafers 1 and the insulating plates 55 held in the boat 50 are negligible.

The supplementary heating process performed during or after the boat loading process will now be explained. In order to raise the reaction chamber temperature to the treatment temperature in a timely manner, the reaction chamber 14 is usually heated to a standby temperature less than a predetermined treatment temperature by about 150 to 200° C. by the heater 22 installed outside of the process tube 11 for heating the reaction chamber 14.

Since the wafers 1 in the upper portion are loaded into the boat 50 prior to an entering of the bottom portion wafers 1, the difference in length of thermal exposure entails a significant difference in the heat treatment quality. Therefore, each of the wafers 1 have non-uniform thermal exposure, which varies longitudinally, despite being processed under the same heat treatment setting. Accordingly, in this preferred embodiment, by providing supplementary heating to the lower group of the wafers 1 held in the lower portion of the boat 50 with the sub-heater 45 during or after the boat loading process, discrepancies in thermal exposures of the wafers 1 in different portions of the boat 50 can be reduced, or more specifically, between the wafers 1 held in the upper portion of the boat 50 and in the lower portion. The speed at which the boat 50 is loaded into the reaction chamber 14 and the difference in temperature between the inside and the outside of the heat treatment chamber 14 preferably need to be taken into account when selecting the timing of the heating of the sub-heater 50 to overcome discrepancy in thermal exposure.

The heater line 47 of the sub-heater 45 for radiating heat upward is arranged forming plural concentric circles, each having a different diameter, to thereby provide intra-wafer uniformity in temperature in respective wafers 1. Moreover, even the central portion of the wafer 1 can be effectively heated since the sub-heater 45 has the heater line 47 laid on the central portion of the circular casing 46b that are perpendicularly extended therefrom to the hollow post 33 to connect with the feeding line 48 and connectors 49 therein, which are protected against the high temperature of the reaction chamber 14.

The sub-heater 45 is connected to the fixed hollow post 33 while the boat 50 is mounted on the hollow shaft 34 in rotation. Such configuration enables a rotation of the boat, which enables a uniform heating of the wafers 1 by the sub-heater 45. The circular casing 46b of the enclosure 46 included in the sub-heater 45 does not interfere with the rotation of the three supporting bars 53 since it has an outer diameter less than that of the wafer 1. And although the insulating plates 55 rotate with the boat 50, they are not interfered by the tubular support 46a since the width of the cutaway portion 56 is set to be greater than the outer diameter of the tubular support 46a. Further, the diameter of the hollow shaft 34 can be tailored to accommodate a heavy boat that can be safely mounted thereon and rotated.

After the boat 50 is loaded into the reaction chamber 14, the process tube 11 is evacuated through the exhaust line 17 and then heated to a predetermined temperature, i.e., a target temperature preset in sequence control of the temperature controller 23 (for example, about 600 to 1300° C.) by the sectional heaters 22a to 22e of the heater 22. At this time, the difference between the actual measured inner temperature of the reaction chamber 14 and the target temperature of the sequence control is corrected by the feedback control based on the temperatures measured by the thermocouples 25a to 25e.

In this preferred embodiment of the present invention, to improve uniformity in temperature distribution throughout the upper and lower portions of the boat 50, a zone control is established by dividing the heater 22 into five sections, each section having sectional heaters 22a to 22e, respectively, and further installing the thermocouples 25a to 25e thereto, respectively. Therefore, for example, if the difference between the measured temperature of the thermocouple 25e corresponding to the lower group of the wafers 1 and those of the other thermocouples 25a to 25d remains within a predetermined range for a set period of time, the operation of providing supplementary heat to the lower group of the wafers 1 by employing the sub-heater 45 is suspended.

After reaching the stabilization of the inner temperature of the reaction chamber 14 by the temperature control method described above, a processing gas is introduced into the heat treatment chamber 14 through the supply line 19. The introduced processing gas flows upward through the reaction chamber 14 and then into the exhaust path 18, so that it is exhausted through the exhaust line 17. While flowing through the reaction chamber 14, the processing gas encounters and reacts with surfaces of the wafers 1 to carry out the heat treatment process thereon. The uniformity in temperature distribution and quality of heat treatment on a wafer is further enhanced by rotating the boat 50 by the boat rotating device 31.

In this preferred embodiment, by disposing the plural number of the insulating plates 55 horizontally in the bottom region of the boat 50, i.e., the region below the sub-heater 45, the lower group of the wafers 1 are arranged away from the boat bottom region, away from the furnace mouth 15, place where uniform temperature distribution is difficult to obtain. Thus under such improved arrangement, the inter-wafer uniformity in temperature is enhanced. Although the temperature distribution in a horizontal plane of the insulating plates 55, is deteriorated by the cutaway portions 56 thereof, this deteriorating effect on the lower group of the wafers 1 is minimized by arranging the insulating plates 55 so that the cutaway portions 56 radially extend to different directions, to thereby prevent overlapping of the cutaway portions 56.

After the heat treatment process for the wafers 1 is carried out, at which time a predetermined processing period has elapsed, the heating operation of the sectional heater 22a to 22e of the heater 22 is suspended by the sequence control of the temperature controller 23, and thereby the inner temperature of the reaction chamber 14 is reduced to the standby temperature. Also at this time, the difference between the actual reducing inner temperature of the reaction chamber 14 due to the sectional heaters 22a to 22e and the target temperature of the sequence control is corrected by the feedback control based on the temperature measurements obtained by the thermocouples 25a to 25e.

After the inner temperature of the reaction chamber 14 is reduced to a predetermined temperature, or after a predetermined processing period has elapsed, the cover 30 is de-elevated to provide an opening in the furnace mouth 15, and the wafers 1 while being held in the boat are unloaded from the process tube 11 therethrough.

In the boat unloading process, since the lower portion of the boat 50 is first unloaded from the reaction chamber 14, the wafers 1 in the bottom portion receives less of the thermal treatment than the ones in the upper portions.

Accordingly, in this preferred embodiment, by providing supplementary heating in the lower portion of the boat 50 with the sub-heater 45 during or before the boat unloading process, non-uniformity in thermal characteristics in the wafers 1 can be reduced, or more specifically, between the lower group of the wafers 1 and the upper group of the wafers 1. Furthermore, the timing of the heating of the sub-heater 45 is preferably chosen by taking into account the non-uniform thermal characteristics between the lower and upper groups of the wafers 1, which depends on the unloading speed of the boat 50 from the reaction chamber 14 and on the difference in temperatures between the inside and is the outside the reaction chamber 14.

Nowadays, in an effort to suppress formation of a natural oxide film on a wafer, it has become a common practice to install a load lock chamber below the reaction chamber having a nitrogen or vacuum ambience. However, in the absence of such a chamber, the wafers are exposed to the ambience outside the reaction chamber during the boat unloading process, and the natural oxide films are formed on the wafers. And since the natural oxide film is formed easily at high temperatures, it is advised to unload the boat 50 without the heating operation of the sub-heater 45. But if the boat unloading process is performed without the heating operation of the sub-heater 45, the formation of the natural oxide film of the lower group of the wafers 1 is different from that of the upper group of the wafers 1 since the thermal characteristics of the lower and upper groups of the wafers 1 are different from each other. This can be problematic, by deteriorating electrical characteristics of IC products made by using such wafers. Accordingly, in view of the above problem, it is desirable to allow the sub-heater 45 to heat the lower group of the wafers 1 during or before the boat unloading process, in order to reduce difference in thermal characteristics in the wafers 1, or more specifically, between the lower group of the wafers 1 and the upper group of the wafers 1.

After the boat 50 is unloaded from the reaction chamber 14, the processed wafers 1 are discharged from the boat 50. By repeatedly performing above described process, wafers can be batch processed.

Further, if the repeated use of the insulating plates 55 result in contamination thereof having accumulated reactants and non-reacted remainder of the processing gases, the insulating plates 55 are discharged from the boat 50 and cleaned. More specifically, the insulating plates can be easily discharged from the boat 50 by retracting the cutaway portion from the tubular support 46a while allowing the periphery edge of the insulating plates 55 to be extracted from the supporting portions 54. In addition, the sub-heater 45 is detached from the hollow post 33 by unscrewing the bolts 46c.

Following advantages can be achieved by the preferred embodiment of the present invention.

1) In the boat rotating device, by attaching the sub-heater on a fixed post disposed in the rotatable hollow shaft for rotating the boat, the sub-heater uniformly heats the entire face of a wafer thereabove, and the feeding lines for supplying electricity to the sub-heater are connected to the power source without a slip ring.

2) In the boat rotating device having a fixed post and a rotatable hollow shaft by disposing the boat and the insulating portion on the rotatable hollow shaft enclosing the fixed post, the outer diameter of the rotatable hollow shaft is easily enlarged so that the rotatable hollow shaft can stably support and rotate a bigger load, i.e., a bigger boat and insulating portion.

3) In view of 1) and 2), since uniformity of inter-wafer and intra-wafer temperature distributions is improved, the precision, reliability and production yield are increased, and further, overall quality and reliability of an IC product can be improved while reducing processing period.

4) By arranging the heater line in a form of concentric circles having different diameters in the circular casing, which is horizontally attached to the tubular support, both ends of the heater line at the central portion of the circular casing enables the central portion of the wafer to be effectively heated and thereby the entire surface of the wafer is uniformly heated.

5) By connecting both ends of the heater line to the feeding lines through the connectors in the fixed post, the feeding lines and connectors are protected from the high temperature ambience of the reaction chamber by the fixed hollow post and the rotatable hollow shaft, thereby extending the lifetime of the feeding lines, connectors, and the sub-heater.

6) By horizontally disposing a plural number of the insulating plates below the sub-heater, the lower group of the wafers is placed away from the furnace mouth, where it is most difficult to control the temperature by the main heater, thereby improving inter-wafer uniformity in temperature.

7) By forming the cutaway portion in the insulating plate, whose width is greater than the outer diameter of the tubular support, the insulating plates contaminated through the repeated uses are easily exchanged with a new one or cleaned for reuse.

8) By disposing the insulating plates so that its cutaway portions radially extend to different directions, thus preventing overlapping thereof, the adverse effect of the cutaway portions on the lower group of the wafers is minimized, and the intra-wafer uniformity in temperature in the lower group of the wafers is improved.

9) By removably installing the sub-heater on the fixed hollow post, the contaminated sub-heater can easily be exchanged with a new one or cleaned for reuse.

Figure 6:
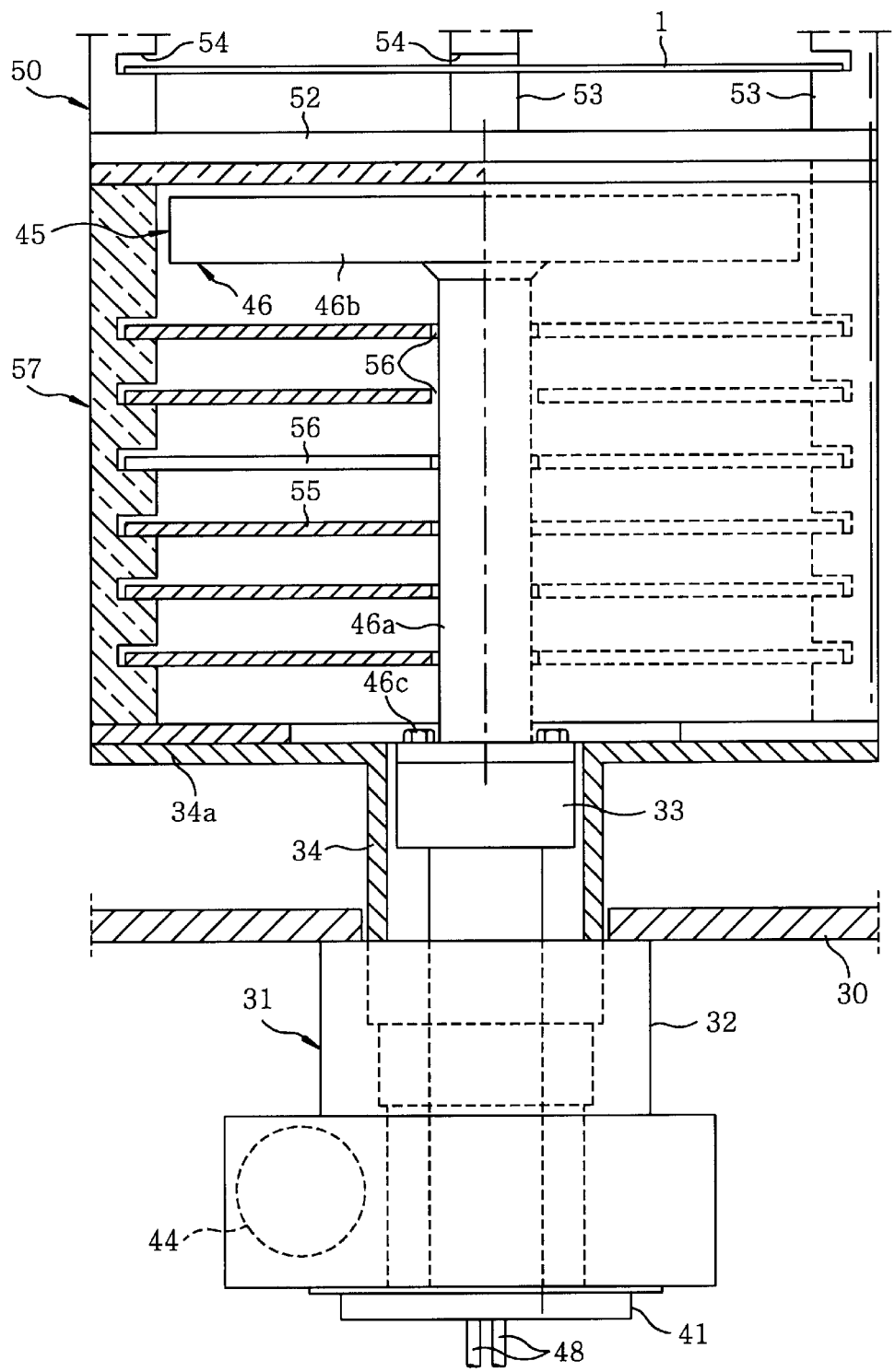
FIG. 6 presents a partial vertical cross sectional view of a heat treatment apparatus in accordance with a second preferred embodiment of the present invention.

Referring to FIG. 6, there is provided a partial vertical cross sectional view of a vertical heat treatment apparatus in accordance with a second preferred embodiment of the present invention.

The second preferred embodiment is different from the first preferred embodiment in that the boat 50 is disposed on a revolving insulating unit 57 of a cylindrical shape with its upper end closed. The revolving insulating unit 57 contains therein a plurality of insulating plates 55 and the sub-heater 45, wherein the revolving insulating unit 57 is disposed on the rotatable hollow shaft 34 of the boat rotating device 31 through the flange portion 34a.

As in the first preferred embodiment of the present invention, the sub-heater 45 is divided into the vertically extended portion (corresponding to the tubular support 46a and the heater line 47 therein) and the horizontal circular portion (corresponding to the circular casing 46b and the heater line 47 therein). The horizontal circular portion is located inside the revolving insulating unit 57, particularly the upper portion of the revolving insulating unit 57 and the insulating plates 55 are disposed under the horizontal circular portion. Also, the sub-heater 45 is fixedly mounted on the fixed hollow post 33 as in the first embodiment, the insulating plates rotates with the revolving insulating unit 57. The electric feeding lines 48 are also detachably provided to the sub-heater 45 through the fixed hollow post as in the first embodiment.

In the present embodiment, since the sub-heater 45 is enclosed inside the revolving insulating unit 57, its heating efficiency is slightly lower, but the revolving insulating unit 57 prevents the insulating plates 55 and the sub-heater 45 from being contaminated by the reactants and non-reacted residues of the processing gases.

It is to be appreciated that the preferred embodiments of the present invention can be varied appropriately without departing from the scope of the present invention.

For example, in lieu of the main heater 22 divided into five sectional heaters 22a to 22e, other heaters divided into two to four or six sectional heaters can be employed.

It should be appreciated that the thermocouples can be disposed without corresponding to the position and number of the sectional heaters. And it should be also appreciated that the thermocouples can be disposed between the inner tube and outer tube and/or between the process tube and the heater instead of locating them near the wafers.

It should be noted that as well as oxidation and diffusion processes the heat treatment can be one used in a carrier activation process after ion implantation, a reflow process for planarization, an annealing process or even a film forming process.

Furthermore, it should be noted that the wafers can be replaced by photo masks, printed circuit boards, liquid crystal panels, optical disks and magnetic disks as an object to be processed.

The present invention is also applicable to other types of semiconductor fabricating apparatus and to other types of a heat treatment apparatus, such as vertical batch type reduced pressure CVD apparatus, as well as a vertical batch type heat treatment apparatus.

While the invention has been shown and described with respect to the preferred embodiments, it will be understood by those skilled in the art that various changes and modifications may be made without departing from the spirit and scope of the invention as defined in the following claims.

What is claimed is:

1. A heat treatment apparatus comprising:
    a vertically disposed process tube defining a reaction chamber therein;
    a main heater for heating the reaction chamber, the main heater being disposed outside of the process tube;
    a boat for holding a plurality of wafers, the boat being loaded into and unloaded from the reaction chamber; and a boat rotating device for rotating the boat;

wherein the boat rotating device includes a rotatable hollow shaft assembly and a fixed shaft coaxially disposed inside the rotatable hollow shaft assembly, and wherein a sub-heater is attached to an upper end of the fixed shaft, and the boat and an insulating portion are disposed on the rotatable hollow shaft assembly.

2. The heat treatment apparatus of claim 1, further comprising feeding lines for supplying electricity to the sub-heater, a part of the feeding lines being disposed inside the fixed shaft and detachably connected to the sub-heater.

3. The heat treatment apparatus of claim 1, wherein the sub-heater includes a vertically extended portion and a horizontal circular portion located thereon, and wherein the insulating portion includes one or more insulating plates disposed under the circular portion of the sub-heater, each insulating plate having a cutaway portion which extends from a center portion of said each insulating plate to a circumference thereof, into which the vertically extended portion is removably inserted.

4. The heat treatment apparatus of claim 2, wherein the sub-heater includes a vertically extended portion and a horizontal circular portion located thereon, and wherein the insulating portion includes one or more insulating plates disposed under the circular portion of the sub-heater, each insulating plate having a cutaway portion which extends from a center portion of said each insulating plate to a circumference thereof, into which the vertically extended portion is removably inserted.

5. A heat treatment apparatus comprising:
   a vertically disposed process tube defining a reaction chamber therein;
   a main heater for heating the reaction chamber, the main heater being disposed outside of the process tube;
   a revolving insulating unit; and
   a boat for holding a plurality of wafers, the boat being loaded into and unloaded from the reaction chamber, the boat being disposed on the revolving insulating unit and rotated therewith;
   wherein a horizontal circular portion of a sub-heater is fixedly installed inside the revolving insulating unit or an upper part thereof, and one or more feeding lines for supplying electricity to the sub-heater are provided substantially along a rotational axis of the boat.

6. A method for fabricating semiconductor devices, comprising the steps of:
   loading a plurality of wafers into a boat;
   loading the boat into a reaction chamber of a vertically disposed process tube;
   heating the plurality of wafers with a sub-heater installed on a fixed shaft aligned with respect to a vertical axis of the boat while rotating the boat with a rotatable hollow shaft assembly disposed outside the fixed shaft, during or after loading the boat into the reaction chamber;
   processing the plurality of wafers by supplying one or more processing gases to flow into the reaction chamber when a temperature thereof reaches a treatment temperature;
   reducing the temperature of the reaction chamber;
   unloading the boat from the reaction chamber; and
   discharging the plurality of wafers from the boat.

7. A method for fabricating semiconductor devices by using the heat treatment apparatus of claim 1, comprising the steps of:
   loading the plurality of wafers into the boat;
   loading the boat into the reaction chamber of the vertically disposed process tube;
   heating the plurality of wafers with the sub-heater installed on the fixed shaft aligned with respect to a vertical axis of the boat while rotating the boat with the rotatable hollow shaft assembly disposed outside the fixed shaft, during or after loading the boat into the reaction chamber;
   processing the plurality of wafers by supplying one or more processing gases to flow into the reaction chamber when a temperature thereof reaches a treatment temperature;
   reducing the temperature of the reaction chamber;
   unloading the boat from the reaction chamber; and
   discharging the plurality of wafers from the boat.

8. A method for fabricating semiconductor devices by using the heat treatment apparatus of claim 5, comprising the steps of:
   loading the plurality of wafers into the boat;
   loading the boat into the reaction chamber of the vertically disposed process tube;
   heating the plurality of wafers with the sub-heater installed on a fixed shaft aligned with respect to a vertical axis of the boat while rotating the boat with a rotatable hollow shaft assembly disposed outside the fixed shaft, during or after loading the boat into the reaction chamber;
   processing the plurality of wafers by supplying one or more processing gases to flow into the reaction chamber when a temperature thereof reaches a treatment temperature;
   reducing the temperature of the reaction chamber;
   unloading the boat from the reaction chamber; and
   discharging the plurality of wafers from the boat.

* * * * *